United States Patent
Sultenfuss et al.

(10) Patent No.: US 7,519,847 B2
(45) Date of Patent: Apr. 14, 2009

(54) SYSTEM AND METHOD FOR INFORMATION HANDLING SYSTEM CLOCK SOURCE INSITU DIAGNOSTICS

(75) Inventors: Andrew T. Sultenfuss, Leander, TX (US); Christian L. Critz, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 395 days.

(21) Appl. No.: 11/145,639

(22) Filed: Jun. 6, 2005

(65) Prior Publication Data

US 2006/0276988 A1 Dec. 7, 2006

(51) Int. Cl.
*G06F 1/04* (2006.01)
*G06F 1/12* (2006.01)
*G06F 11/00* (2006.01)

(52) U.S. Cl. .................... 713/600; 713/500; 713/501; 713/502; 713/601; 714/100; 714/48; 714/52; 714/55; 714/57

(58) Field of Classification Search ............. 713/600, 713/601, 500, 501, 502; 714/48, 52, 55, 714/57, 100
See application file for complete search history.

(56) References Cited

U.S. PATENT DOCUMENTS

| | | | |
|---|---|---|---|
| 4,893,097 A * | 1/1990 | Zwack .................. | 331/176 |
| 5,541,936 A | 7/1996 | Tanaka | |
| 6,009,028 A | 12/1999 | Akiyma | |
| 6,145,102 A * | 11/2000 | Klein et al. ............ | 714/47 |
| 6,496,030 B1 | 12/2002 | Kaneko | |
| 2003/0115397 A1* | 6/2003 | Hawkins et al. ........ | 710/305 |
| 2005/0216780 A1* | 9/2005 | Sung et al. ............ | 713/500 |

* cited by examiner

*Primary Examiner*—Thomas Lee
*Assistant Examiner*—Michael J Brown
(74) *Attorney, Agent, or Firm*—Hamilton & Terrile, LLP; Robert W. Holland

(57) ABSTRACT

A clock diagnostics module, such as a state machine, integrated into an integrated clock controller monitors clock signals associated with the integrated clock controller and reports the status of the clock signals through a management bus, such as an SMBus. For instance, a counter integrated into the integrated clock controller counts clock signal cycles that occur in a management bus cycle and compares the clock signal with an expected value to determine the accuracy of the clock. A power on reset allows the management bus to read the clock diagnostics module in the event of clock controller failure.

20 Claims, 3 Drawing Sheets

SYSTEM AND METHOD FOR INFORMATION HANDLING SYSTEM CLOCK SOURCE INSITU DIAGNOSTICS

BACKGROUND OF THE INVENTION

1. Field of the Invention

The present invention relates in general to the field of information handling system diagnostics, and more particularly to a system and method for information handling system clock source insitu diagnostics.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are rapidly increasing in system hardware complexity, which can overwhelm field diagnostic review of a complete system when trying to determine a failure mechanism. As a result, information handling systems are often returned to the manufacturer even where a failure is repairable on site because the diagnosis of the failure is too complex. The return of repairable systems increases manufacturer warranty costs and negatively impacts the end user experience. However the performance of more advanced test techniques insitu to clearly identify failures and what is operating correctly are not practicable since such tests typically require external probes and or fixtures that are generally not available in the field. Two domains that are central to proper diagnosis of system failure are the power domain and the clocking domain. Information handling systems typically integrate a clock source, such as a Ck410 integrated clock controller, which allows for several features and clock domains. The accuracy of the oscillator input to a clock controller and the accuracy of the clock output are not readily confirmed at a system level or through peripheral devices. Instead, a failing system, device or port is known without an insitu way to isolate the failure to the clock. Indeed, discrete elements that use a clock source to implement clock trees are unbounded to conventional diagnostics with a probe approach. On die testing of a clock source is questionable since the power and clock failures cannot be determined from run time execution faults.

In addition to excessive complexity, conventional clock diagnostics also generally are expensive to implement. For instance, the Joint Test Action Group (JTAG) standard requires the use of an independent clock source and protocol with an associated high cost impact. Another conventional technique uses a counter for counting of a clock input, such as with a flip/flop, however, counting input provides only a narrow view of clock operations. Phase lock is used for PHY and PLL tracking within Verilog and Link status, however, phase lock for clock diagnostics fails to test the usage of clock data in a larger sense. Status indicators track clock operation, however, the power and clock status are generally are not readily available for insitu diagnostics since they require each other. Typically, for instance, information regarding the operation of a clock controller cannot be communicated through a management bus, such as the SMBus, unless the clock is operational. Thus, if diagnostics are required for a "hung" chip, system level management buses are generally not a reliable medium for communication of diagnostics information.

SUMMARY OF THE INVENTION

Therefore a need has arisen for a system and method which diagnoses clock domains insitu with support internal to an information handling system.

In accordance with the present invention, a system and method are provided which substantially reduce the disadvantages and problems associated with previous methods and systems for diagnosis of clock domains. A clock diagnostics module integrated in a clock controller interfaces with a management bus to support insitu diagnostics of one or more clock domains. Access through the management bus allows an information handling system to diagnose clock signals at a system level.

More specifically, a clock diagnostics module is integrated in the die of an integrated clock controller to monitor clock signals for one or more domains, such as the oscillator input to the clock controller, a clock signal output from the clock controller or one or more phased lock loop clock signals. The clock diagnostics module communicates through a management bus interface, such as a SMBus interface, with a management processor, such as an embedded controller, for system access to clock signal diagnosis independent of the operation state of an information handling system. Power on reset commands from a clock diagnostics engine running on the management processor are communicated to the clock diagnostics module through the management bus to retrieve diagnostics information independent of system operation. The clock diagnostics module is, for instance, a counter that compares the number of clock signal cycles with management bus cycles to diagnose clock operations.

The present invention provides a number of important technical advantages. One example of an important technical advantage is that system level diagnosis of clock operations is available without external probes or tools. Thus, for instance, customer site insitu diagnosis of an information handling system failure can detect and isolate clock problems that exist or establish proper clock operations to permit trouble shooting in other areas. Reduced information handling system returns due to more complete insitu diagnosis avoids unnecessary expenses for system replacement shipments.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Insitu diagnostics of clock operations under information handling system control with an integrated clock diagnostics module allows isolation of clock related faults without the use of external probes. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
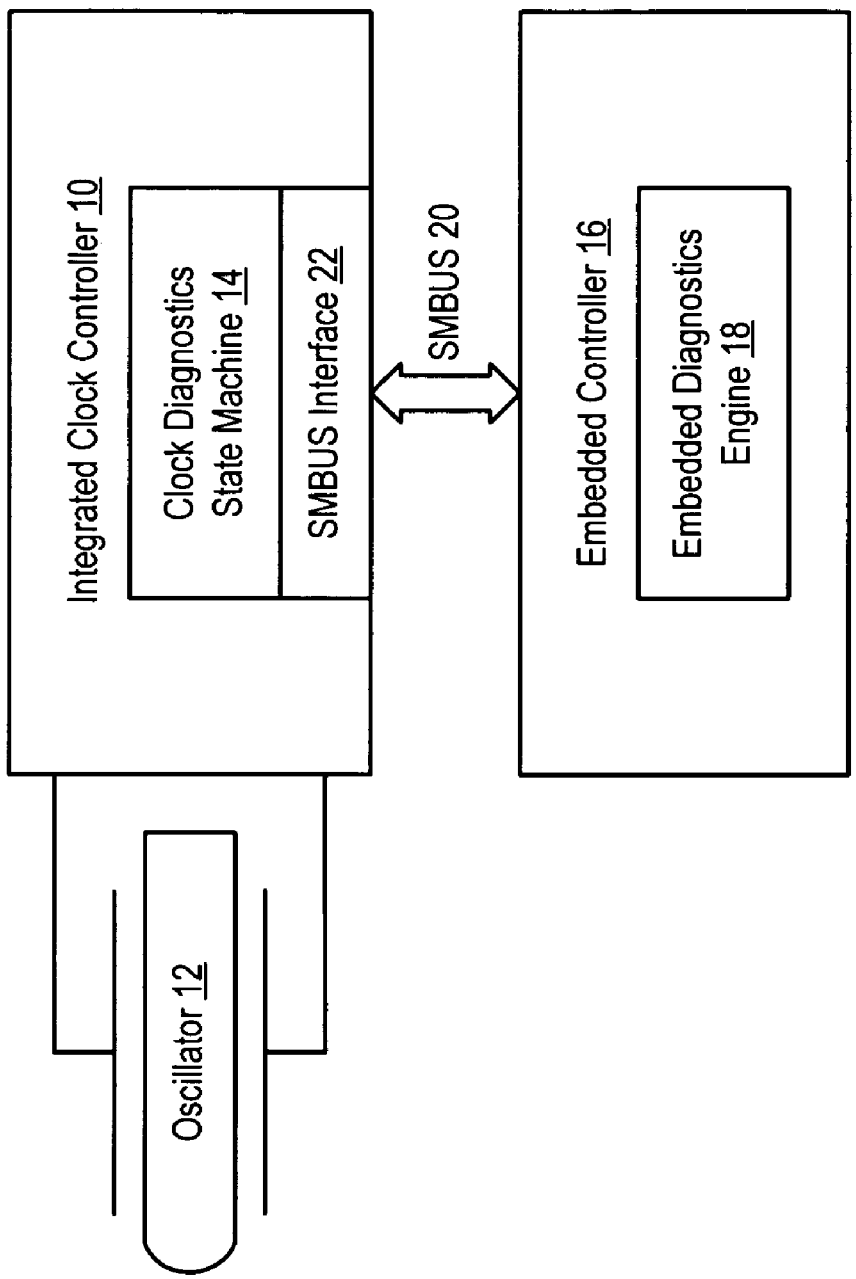
FIG. 1 depicts a block diagram of an integrated clock controller having insitu diagnostics interfaced with a management processor.

Referring now to FIG. 1, a block diagram depicts an integrated clock controller having insitu diagnostics interfaced with a management processor. Integrated clock controller 10 is, for example, a Ck410, Ck409 or Ck408 clock controller that accepts a basic clock signal from an oscillator 12 to output one or more clock domains for use in an information handling system. A clock diagnostics state machine 14 is integrated into clock controller 10 such as by incorporation into the semiconductor die of controller 10 so that clock diagnostics are available under the control of an information handling system. For example, an embedded controller 16 or other management processor available on an information handling system supports a clock diagnostics engine 18 that communicates with clock diagnostics state machine 14 over an SMBus 20 through an SMBus interface 22 of clock controller 10. For instance, clock diagnostics engine 18 queries clock diagnostics state machine 14 to determine the operational state of the OSC or crystal input from oscillator 12, output of one or more phased lock loop (PLL) time domains running globally or individually, SSC mode outputs and each clock domain output. Embedded controller 16 operates independent of other information handling system components, so clock diagnostics engine 18 is able to interface with non-free running clock sources to stop and start output, such as with a power on reset, to allow isolation of downstream faults to confirm clock and reset conditions.

Figure 2:
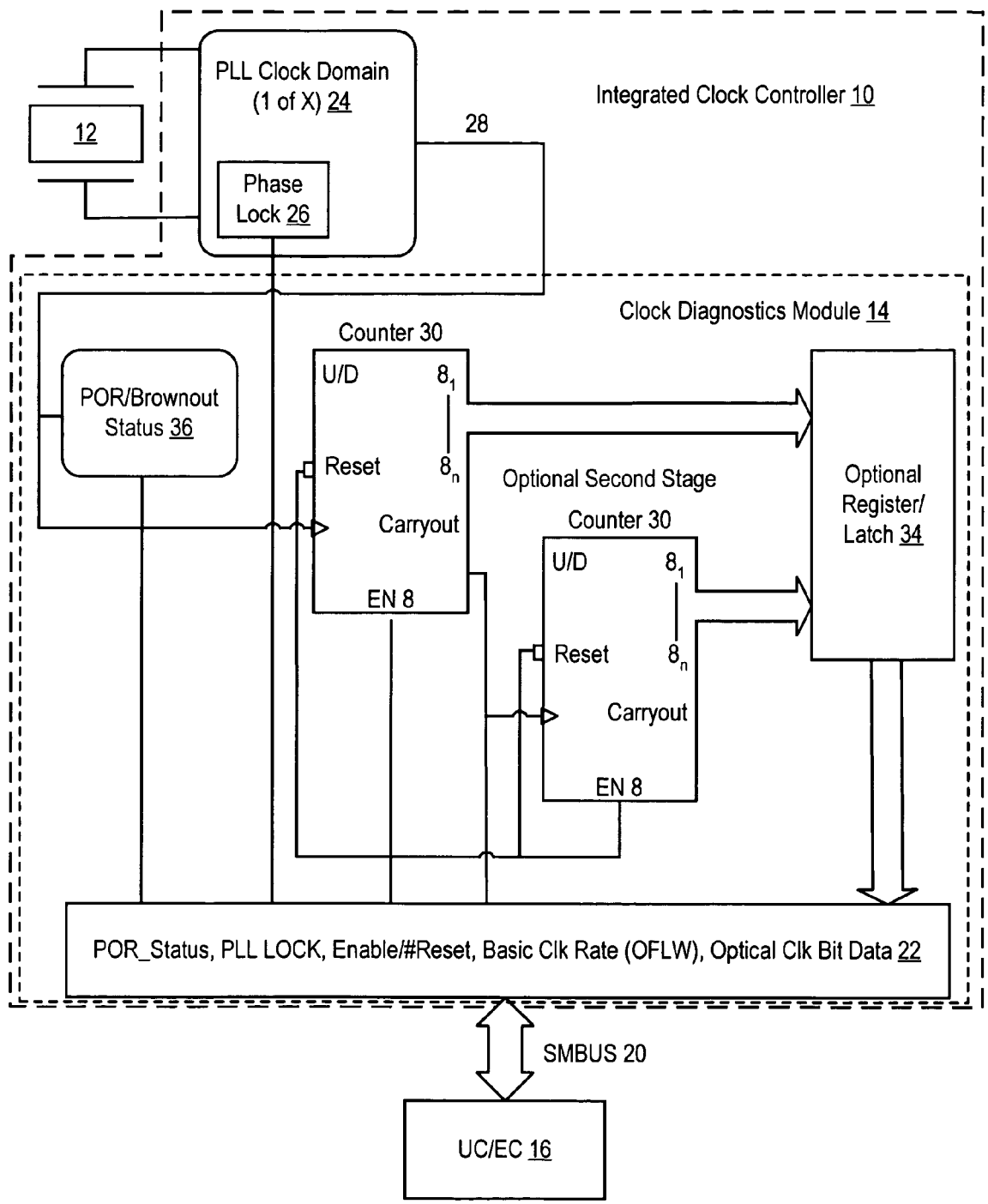
FIG. 2 depicts a circuit diagram of one example of a clock diagnostics module integrated in an integrated clock controller.

Referring now to FIG. 2, a circuit diagram depicts one example of a clock diagnostics module integrated in an integrated clock controller 10. Integrated clock controller 10 outputs plural clock signals including a phased lock loop clock domain 24 generated by a phase lock module 26. The PLL clock signal 28 and a control bus to phase lock module 26 each interface with clock diagnostics module 14. The PLL clock signal is communicated to a counter 30, which counts the number of clock cycles that occur in a predetermined time period. For instance, counter 30 counts the number of clock cycles from the PLL clock signal that occur over a single SMBus clock cycle. SMBus or other management buses typically operate at a reduced clock frequency compared with the clock signals output by clock controller 10 so that clock diagnostics module 14 over samples the clock signal under test for improved accuracy. An optional second stage counter 32 and register/latch 34 interface with counter 30 if needed to help track the number of clock cycles. For instance, at receipt of an SMBus clock signal from SMBus interface 22, counter 30 initiates a count up to a predetermined number of clock signals, such as the number of PLL clock cycles that occur in a SMBus clock cycle. If the number of counted signals equals the expected number at the receipt of the next SMBus clock signal, then the PLL clock signal is determined as operating correctly. In alternative embodiments, counter 30 may count down from the predetermined number of clock cycles so that proper operation is determined if the counter has a value of zero on receipt of the next SMBus signal. As another alternative, latch 34 is set if the counted number of clock signals equals the expected number.

SMBus interface 22 allows user interaction with clock diagnostics module 14 for manual control asserted through embedded controller 16. For instance, SMBus interface 22 allows communication with a power on reset (POR) status module 36 that selectively resets power to integrated clock controller 10 manually test clock inputs and outputs. For instance, if integrated clock controller 10 is faulty or unable to run, manual resets allow diagnostics of integrated clock controller 10 to help isolate the fault. Manual interfacing with clock diagnostics module 14 to test the operation of various clock domains, including the oscillator, narrows down the failure for correction or, alternatively, eliminates the integrated clock controller as the cause of an error.

Figure 3:
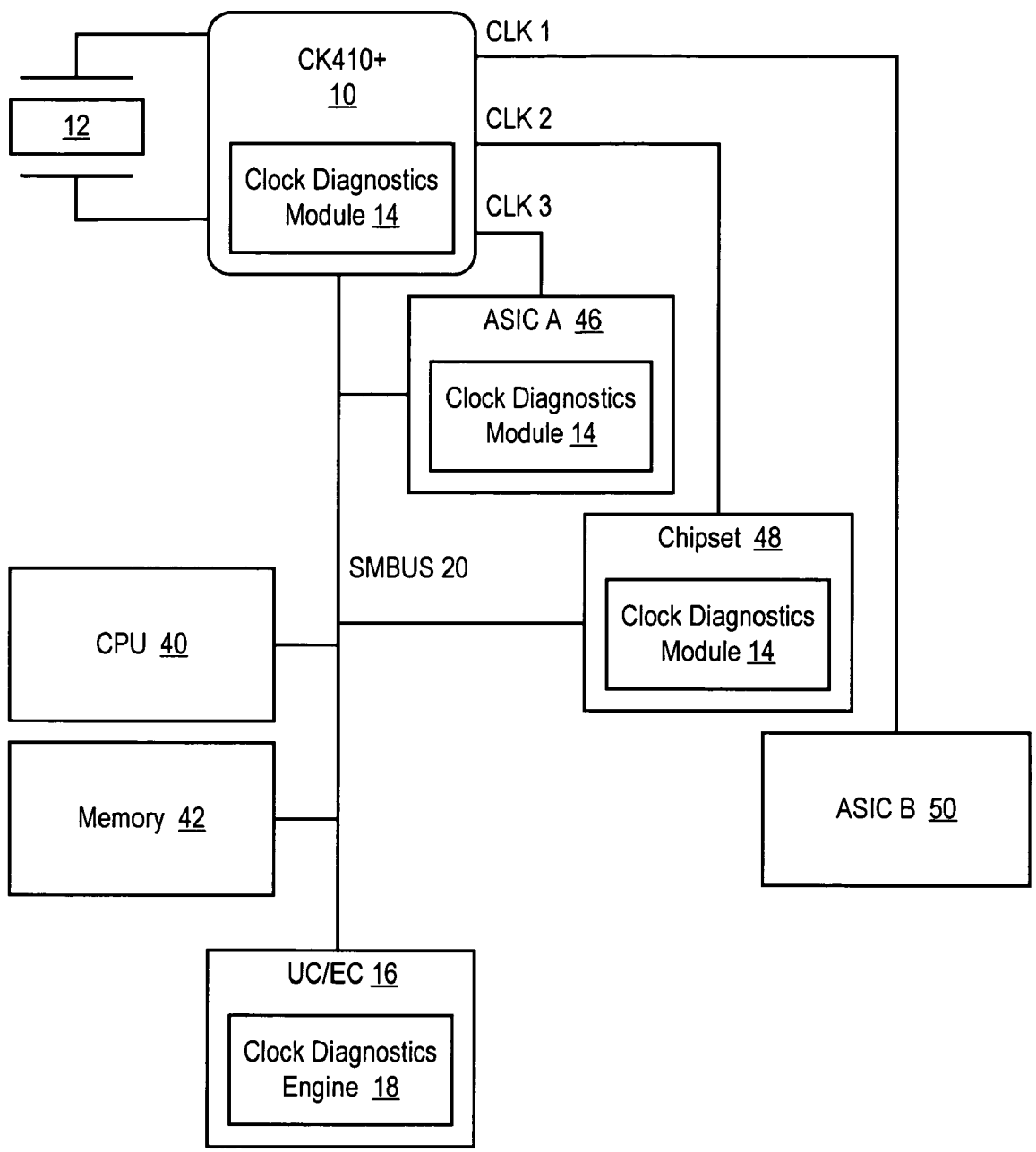
FIG. 3 depicts an information handling system having plural clock domains monitored by plural clock diagnostics modules.

Referring now to FIG. 3, an information handling system 38 is depicted having plural clock domains monitored by plural clock diagnostics modules. Information handling system 38 has a CPU 40 and memory 42 interfaced with each other and with other processing components to process information, such as application specific integrated circuits (ASICs) 46, 48 and 50 that perform specific tasks. In the example depicted by FIG. 3, integrated clock controller 10 provides three clock domains across three primary buses 44 as references for the operation of ASICs 46, 48 and 50. Embedded controller 16 manages the operation of processing components through SMBus 20, including diagnostics for the clock signals of clock domains for processing components having a clock diagnostics module 14. For example, ASIC 46 and ASIC 48 each have a clock diagnostics module 14 that interfaces with clock diagnostics engine 18 to diagnose the clock signal associated with primary buses 44. In this manner, the clock signal provided to ASICs 46 and 48 can be verified at both integrated clock controller 10 and each ASIC to help isolate the location of a fault. ASIC 50 lacks a clock diagnostics module 14 and therefore, the clock domain associated with ASIC 50 is verifiable at the integrated clock controller 10 but not at the ASIC itself.

Although the present invention has been described in detail, it should be understood that various changes, substitutions and alterations can be made hereto without departing from the spirit and scope of the invention as defined by the appended claims.

What is claimed is:

1. A system for providing a clock signal to an information handling system, the system comprising:
    an oscillator operable to provide a signal having a predetermined frequency;
    a clock controller interfaced with the oscillator and operable apply the oscillator signal to generate one or more clock signals;
    a management bus interface integrated with the clock controller and operable to communicate management information with a management bus; and
    a clock diagnostics state machine integrated with the clock controller and interfaced with the management bus interface, the clock diagnostics state machine operable to compare the clock signal with a predetermined clock signal and communicate results of the comparison through the management bus interface to the management bus.

2. The system of claim 1 wherein the management bus is a SMBus.

3. The system of claim 1 wherein the predetermined clock signal comprises the oscillator frequency.

4. The system of claim 1 wherein the predetermined clock signal comprises a phased lock loop signal.

5. The system of claim 1 wherein the predetermined clock signal comprises a clock controller clock signal.

6. The system of claim 1 wherein the clock diagnostics state machine further comprises a counter operable to count up with the clock signal for a predetermined diagnostics time associated with a frequency of the management bus.

7. The system of claim 1 wherein the clock diagnostics state machine further comprises a counter operable to count down with the clock signal for a predetermined diagnostics time associated with a frequency of the management bus.

8. The system of claim 1 further comprising:
    a clock diagnostics engine operating on a management system and operable to communicate with the clock diagnostics state machine through a management bus to read the results of the comparison by a power on reset.

9. A method for diagnosis of an information handling system clock signal, the method comprising:
    generating a clock signal with an integrated clock controller;
    communicating the clock signal to processing components of the information handling system through a clock bus;
    communicating management information between the information handling system processing components through a management bus;
    monitoring the clock signal with diagnostics circuitry embedded on the integrated clock controller; and
    communicating monitoring information from the diagnostics circuitry through the management bus.

10. The method of claim 9 wherein the management bus comprises a SMBus.

11. The method of claim 9 wherein clock signal comprises the frequency of an oscillator associated with the integrated clock controller.

12. The method of claim 9 wherein the clock signal comprises a phase lock loop clock signal.

13. The method of claim 9 wherein the clock signal comprises an integrated clock controller clock signal output.

14. The method of claim 9 wherein monitoring further comprises:
    counting the clock signal with the diagnostics circuitry for a management bus cycle time; and
    diagnosing a clock controller failure if the clock signal count is not a predetermined count associated with the management bus cycle time.

15. The method of claim 9 wherein communicating further comprises:
    applying a power on reset to the integrated clock controller to read clock diagnostics circuitry information.

16. An information handling system comprising:
    a CPU operable to process information;
    memory operable to store the information;
    a primary bus operable to communicate the information between the CPU and memory at a clock signal;
    a clock controller interfaced with the primary bus and operable to generate the clock signal;
    a management processor operable to process management information;
    a management bus interfaced with the management processor and operable to communicate the management information; and
    a clock diagnostics module integrated with the clock controller and interfaced with the management bus, the clock diagnostics module operable to compare the clock signal with a management bus signal and communicate results of the comparison through the management bus to the management processor.

17. The information handling system of claim 16 further comprising:
    a processing component interfaced with the primary bus to receive the clock signal and interfaced with the management bus;
    a clock diagnostics module integrated with the processing component and interfaced with the management bus, the clock diagnostics module operable to compare the clock signal at the processing component with a management bus signal and communicated results of the comparison through The management bus to the management processor.

18. The information handling system of claim 16 wherein the management bus comprises a serial bus.

19. The information handling system of claim 16 further comprising a power on reset associated with the clock diagnostics module, the power on reset operable to communicate clock diagnostics information from the clock diagnostics module in the event of a primary bus clock signal failure.

20. The information handling system of claim 16 wherein the clock diagnostics module comprises a counter operable to compare the number of clock signals on the primary bus with predetermined signals sent by the management bus.

* * * * *